United States Patent
Sakuragawa et al.

(10) Patent No.: US 6,472,953 B1
(45) Date of Patent: Oct. 29, 2002

(54) BAND SWITCHING FILTER USING A SURFACE ACOUSTIC WAVE RESONATOR AND AN ANTENNA DUPLEXER USING THE SAME

(75) Inventors: Toru Sakuragawa, Osaka (JP); Yuki Sato, Osaka (JP); Katsuya Fujii, Osaka (JP); Kozo Murakami, Osaka (JP); Ryoichi Takayama, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/523,340

(22) Filed: Mar. 10, 2000

(30) Foreign Application Priority Data

Mar. 10, 1999 (JP) .......................................... 11-062777

(51) Int. Cl.[7] .............................. H03H 9/72; H03H 9/64
(52) U.S. Cl. ....................................... 333/133; 333/193
(58) Field of Search ............................. 333/132–134, 333/126–129, 202, 193–196, 188, 189, 205, 207, 209, 175

(56) References Cited

U.S. PATENT DOCUMENTS

| | | | | |
|---|---|---|---|---|
| 4,153,887 A | * | 5/1979 | Poppa | 333/172 |
| 4,462,098 A | | 7/1984 | D'Avello et al. | 370/281 |
| 5,065,120 A | * | 11/1991 | Munn | 333/207 |
| 5,065,121 A | * | 11/1991 | Ghadaksaz | 333/205 X |
| 5,917,387 A | * | 6/1999 | Rice et al. | 333/175 X |
| 6,018,281 A | * | 1/2000 | Taguchi et al. | 333/193 |
| 6,085,071 A | * | 7/2000 | Yamada et al. | 333/126 X |
| 6,177,850 B1 | * | 1/2001 | Furutani et al. | 333/185 |

FOREIGN PATENT DOCUMENTS

| | | | |
|---|---|---|---|
| EP | 0 287 671 | | 10/1988 |
| EP | 0 732 805 | | 9/1996 |
| EP | 0 865 095 | | 9/1998 |
| JP | 10150304 | | 6/1998 |
| JP | 10-247833 | * | 9/1998 |
| JP | 11-122139 | * | 4/1999 |
| JP | 2000-101380 | * | 4/2000 |
| JP | 2001-69031 | * | 3/2001 |

OTHER PUBLICATIONS

A. Abramowicz, "MIC Realization of Dielectric Resonator Elliptic Filters", Proceedings of the European Microwave Conference, GB, Tunbridge Wells, Microwave Exhibitions, Vvol. Conf. 19, Sep. 4, 1989, pp. 495–500.

European Search Report corresponding to application No. EP 00 10 4611 dated Nov. 15, 2000.

* cited by examiner

Primary Examiner—Robert Pascal
Assistant Examiner—Barbara Summons
(74) Attorney, Agent, or Firm—RatnerPrestia

(57) ABSTRACT

A band switching filter includes a resonator circuit having a surface acoustic wave resonator, a switching element and an impedance element. The filter selectively passes or attenuates a signal through one of two pass bands using a single filter. The resonant frequency of the resonator circuit can be shifted to another frequency by selectively connecting the surface acoustic wave resonator to an impedance element using a switching element.

4 Claims, 24 Drawing Sheets

FIG. 2A
FIG. 2B
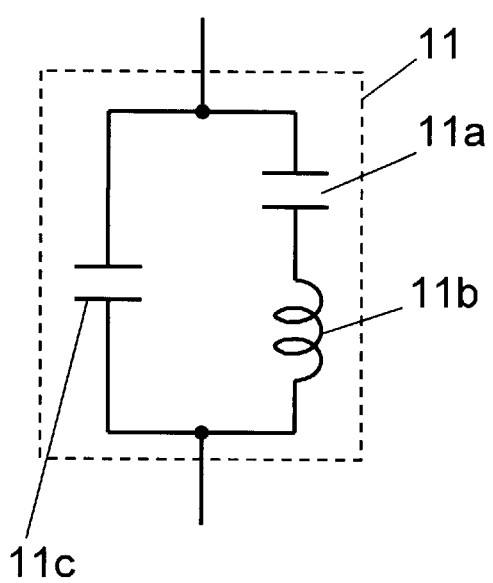
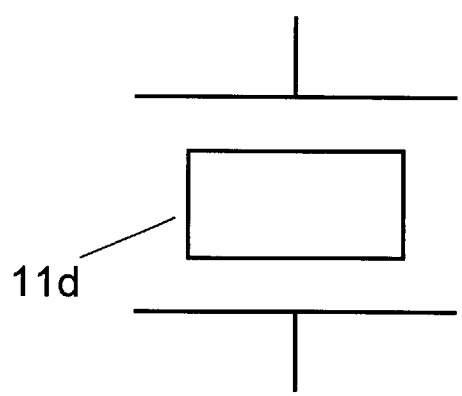

BAND SWITCHING FILTER USING A SURFACE ACOUSTIC WAVE RESONATOR AND AN ANTENNA DUPLEXER USING THE SAME

FIELD OF THE INVENTION

The present invention relates to a band switching filter using a surface acoustic wave resonator and an antenna duplexer using the same.

BACKGROUND OF THE INVENTION

An antenna duplexer of the prior art is generally formed by a distributed constant circuit type resonator such as a coaxial line resonator and number of stages and a construction of filters of a resonator have been determined based on pass bandwidth and attenuation quantity.

The problem in the above antenna duplexer is that it difficult to make the size small because a filter characteristic largely depends on a form of the resonator. For example, a similar problem has existed, even if it has a construction of a band switching filter using a distributed constant circuit type resonator and switching diodes, like Japanese Unexamined Patent 10-150304.

The present invention aims to miniaturize such a band switching filter and an antenna duplexer using it.

SUMMARY OF THE INVENTION

To address this problem, a band switching filter of the present invention is a filter selectively passing or attenuating either one of different two bandwidths and is characterized by that at least one of two resonant frequencies of the surface acoustic wave resonators is moved to an arbitrary resonant frequency, using resonator circuits each composed of at least a surface acoustic wave resonator, a switching element and an impedance element and switching a connection state between the surface acoustic wave resonator and the impedance element through on/off of the switching element.

In accordance with the above, not only the resonator can be miniaturized but also number of stages of filters can be reduced by switching the bandwidth. As a result, the band switching filter can be miniaturized.

Also an antenna duplexer can be miniaturized by using at least one of the above mentioned band switching filter.

BRIEF DESCRIPTION OF THE DRAWINGS

FIG. 2(*a*) is an equivalent circuit of a surface acoustic wave resonator.

FIG. 2(*b*) is a symbol of the equivalent circuit.

DETAILED DESCRIPTION OF THE EXEMPLARY EMBODIMENTS

Exemplary embodiments of the present invention are explained below, using FIGS. 1–21.

(First Exemplary Embodiment)

Figure 1:
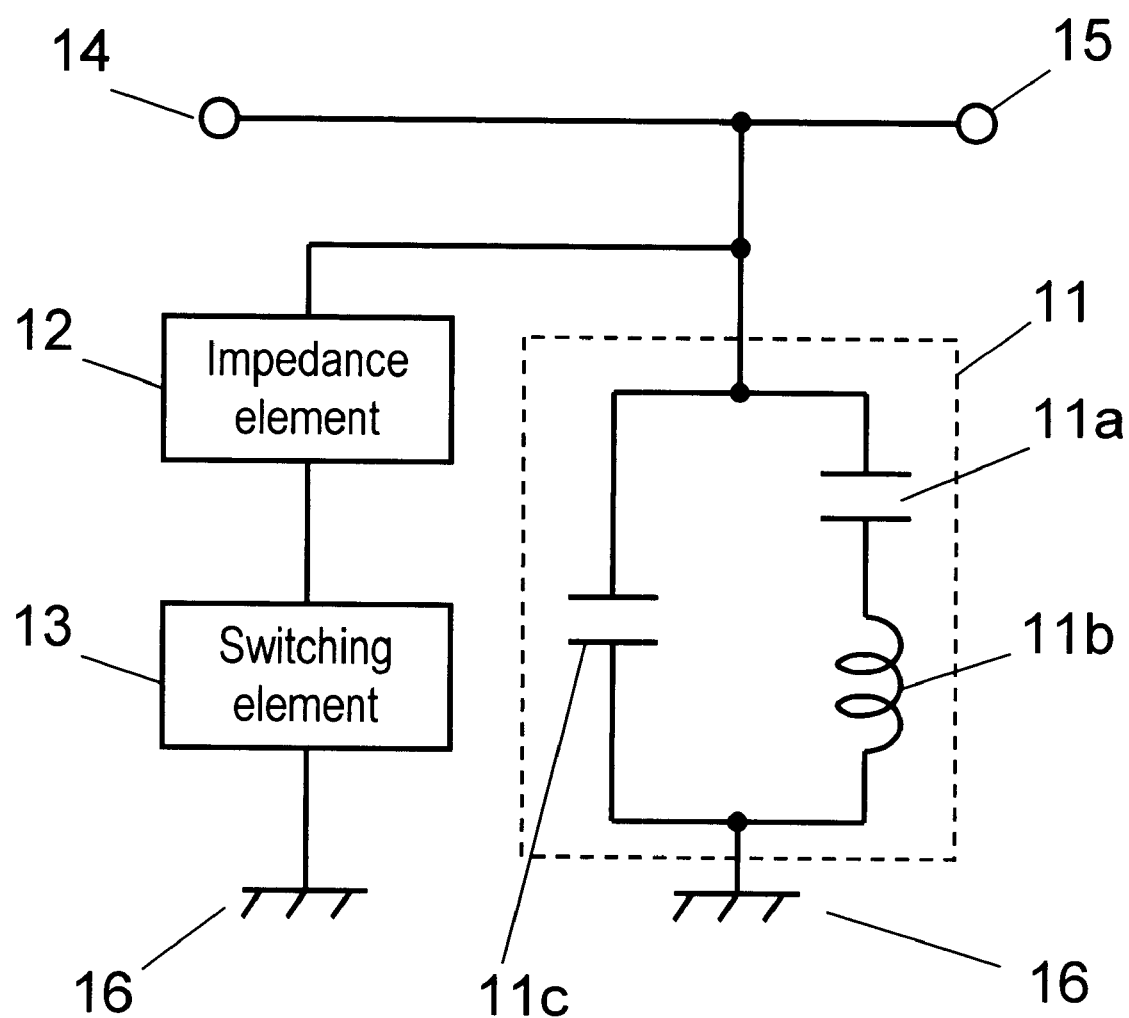
FIG. 1 is a block diagram of a first example of a resonator circuit used in a band switching filter in accordance with a first exemplary embodiment of the present invention.

FIG. 1 is a block diagram of a first example of a resonator circuit used in a band switching filter in accordance with a first exemplary embodiment of the present invention.

Figure 3:
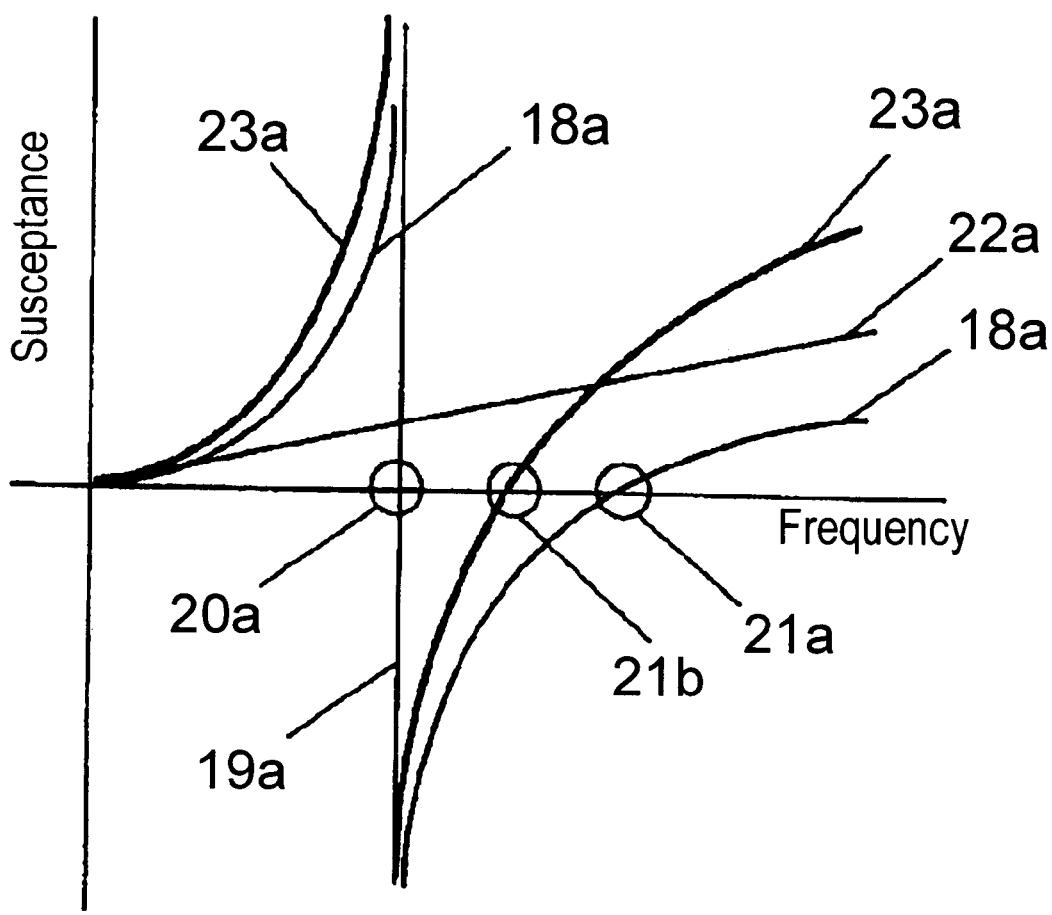
FIG. 3 shows a susceptance characteristic of the first example of a resonator circuit used in a band switching filter in accordance with a first exemplary embodiment of the present invention.
Figure 4:
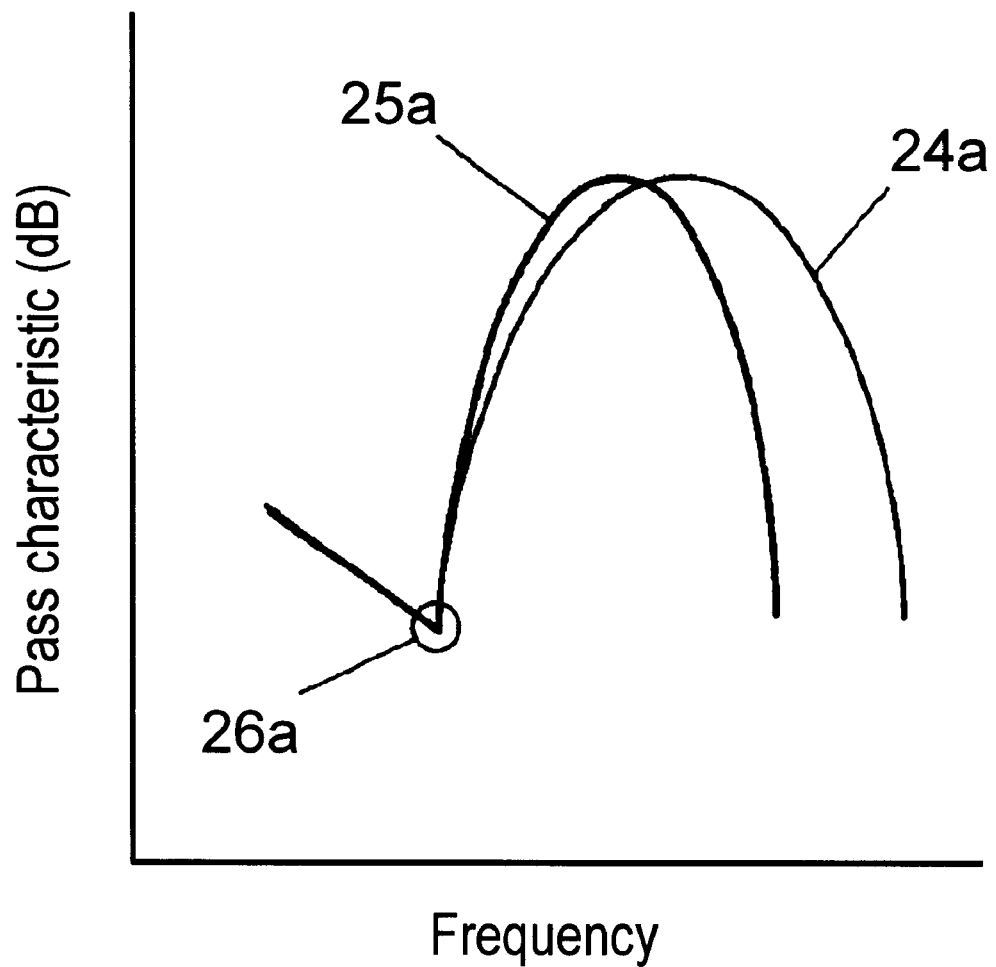
FIG. 4 shows a pass characteristic of the first example of a resonator circuit used in a band switching filter in accordance with a first exemplary embodiment of the present invention.

FIGS. 3 and 4 show characteristics of the first example of a resonator circuit used in a band switching filter in accordance with a first exemplary embodiment of the present invention.

Figure 10:
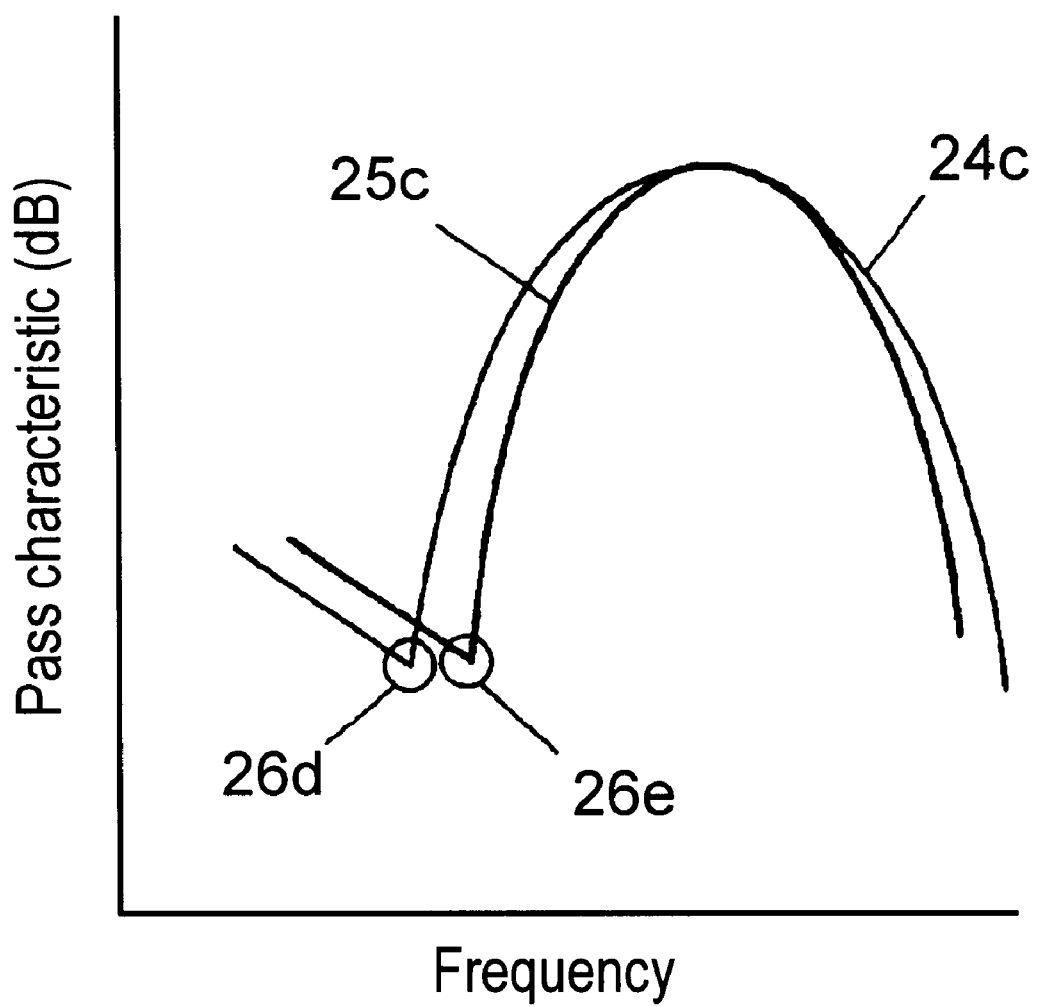
FIG. 10 shows a pass characteristic of the third example of a resonator circuit in accordance with a first exemplary embodiment of the present invention.
Figure 11:
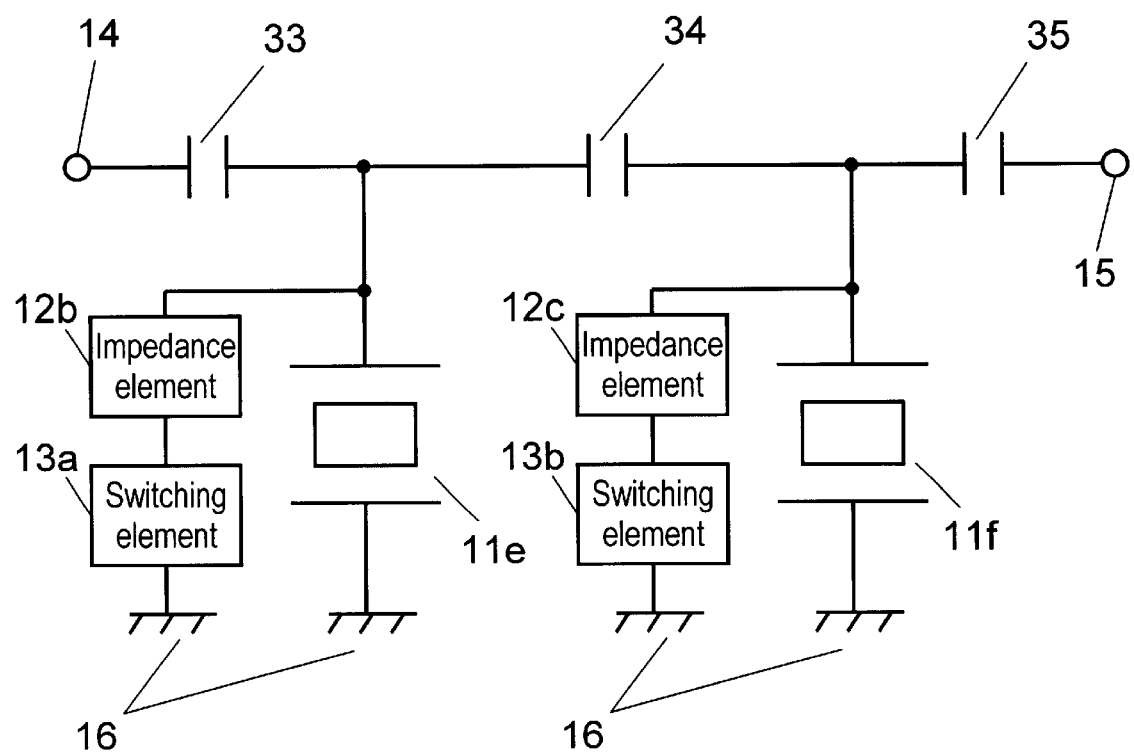
FIG. 11 is a block diagram of a band switching filter in accordance with the first exemplary embodiment of the present invention.
Figure 12:
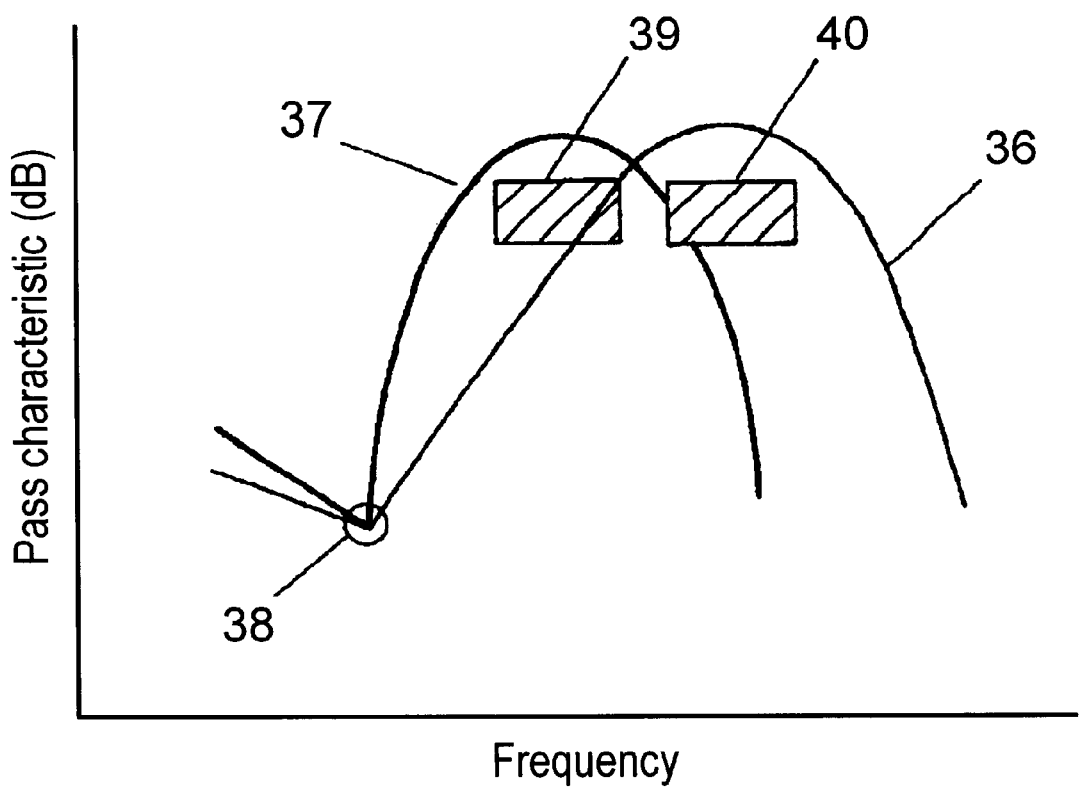
FIG. 12 shows a pass characteristic of the b and switching filter in accordance with the first exemplary embodiment of the present invention.

FIG. 11 is a block diagram of a band switching filter and FIG. 12 shows its pass characteristic. FIGS. 5–10 are the other examples of resonator circuits used in the first exemplary embodiment of the present invention and show their characteristics.

A resonator circuit shown in FIG. 1 includes a surface acoustic wave resonator 11, an impedance element 12, a switching element 13, an input terminal 14, an output terminal 15 and a ground 16. Input terminal 14 is connected with output terminal 15, one terminal of impedance element 12 and one terminal of surface acoustic wave resonator 11. The other terminal of impedance element 12 is connected with one terminal of switching element 13 and the other terminal of switching element 13 is connected with the other terminal of surface acoustic wave resonator 11 and ground 16.

An equivalent circuit of surface acoustic wave resonator 11 is expressed as a parallel circuit of a capacitance element 11c and a series connection of a capacitance element 11a and inductance element 11b as shown in FIG. 2(a). Surface acoustic wave resonator 11 is symbolized as shown in FIG. 2(b) and referred as 11d and is used without any notice, thereafter.

Using a resonator circuit constructed like the above, a parallel resonant frequency of surface acoustic wave resonator 11 can be shifted to an arbitrary resonant frequency. A function of a resonant circuit shown in FIG. 1 is explained below.

FIG. 3 shows a susceptance characteristic of a resonator circuit shown in FIG. 1.

A susceptance of the resonator circuit when switching element 13 is open is shown by thin curves 18a in FIG. 3. Susceptance 18a when Q value of surface acoustic wave resonator 11 is infinity is indicated as intersection 20a of an asymptote 19a and a horizontal line which is zero susceptance and a pass characteristic from the input terminal 14 to the output terminal 15 is shown by curve 24a in FIG. 4. The parallel frequency is indicated as intersection 21a of thin susceptance curve 18a and a horizontal line which is zero susceptance. A series resonant frequency point 20a is shown in FIG. 4 as point 26a.

The susceptance of the resonator circuit when impedance element 12 is a capacitance element and switching element 13 of the resonator circuit is short is a synthesized susceptance 23a of susceptance 22a of the capacitance element and susceptance 18a of surface acoustic wave resonator 11. In this case, there is no change in a series resonant frequency because the absolute value of susceptance 18a of surface acoustic wave resonator 11 is infinity at a series resonant frequency of the resonator circuit and the parallel resonant frequency is shown as a intersection 21b of susceptance curve 23a and a horizontal line which is zero susceptance. That is, intersection 21b when switching element 13 is short circuited is lower in frequency than intersection 21a when switching element 13 is open. Therefore, the pass band shifts towards lower without any change of attenuation pole frequency 26a, as shown as frequency characteristic 25a of FIG. 4.

FIG. 11 is A block diagram of a band switching filter using a resonator circuit shown in FIG. 1 is shown in FIG. 11 and its frequency characteristic is shown in FIG. 12.

A band switching filter shown in FIG. 11 is a band pass filter and includes surface acoustic wave resonators 11e and 11f, impedance elements 12b and 12c, switching elements 13a and 13b, an capacitance elements 33, 34 and 35, an input terminal 14, an output terminal 15 and a ground 16. Input terminal 14 is connected to a terminal of capacitance element 33, the other terminal of capacitance element 33 is connected to a terminal of capacitance element 34, a terminal of surface acoustic wave resonators 11e and a terminal of impedance elements 12b. The other terminal of impedance elements 12b is connected to a terminal of witching elements 13a, the other terminal of capacitance element 34 is connected to a terminal of capacitance element 35, a terminal of surface acoustic wave resonators 11f and a terminal of impedance elements 12c, the other terminal of impedance elements 12c is connected to a terminal of switching elements 13b, the other terminal of capacitance element 35 is connected to output terminal 15, the other terminals of surface acoustic wave resonators 11e and 11f and the other terminals of switching elements 13a and 13b are altogether connected to a ground 16.

In a circuit configuration shown in FIG. 11, the parallel resonant frequency of a resonator circuit shifts by opening or shortening switching elements 13a and 13b. As shown in FIG. 12, a frequency characteristic 36 having pass band 40 is obtained when switching elements 13a and 13b are open and a frequency characteristic 37 having pass band 39 is obtained when switching elements 13a and 13b are short. In both cases, attenuation pole 38 does not change.

According to the above configuration, not only a resonator can be miniaturized but also a filter having frequency characteristics with both pass bands 39 and 40 can be realized with less number of stages by using a band switching filter.

Figure 5:
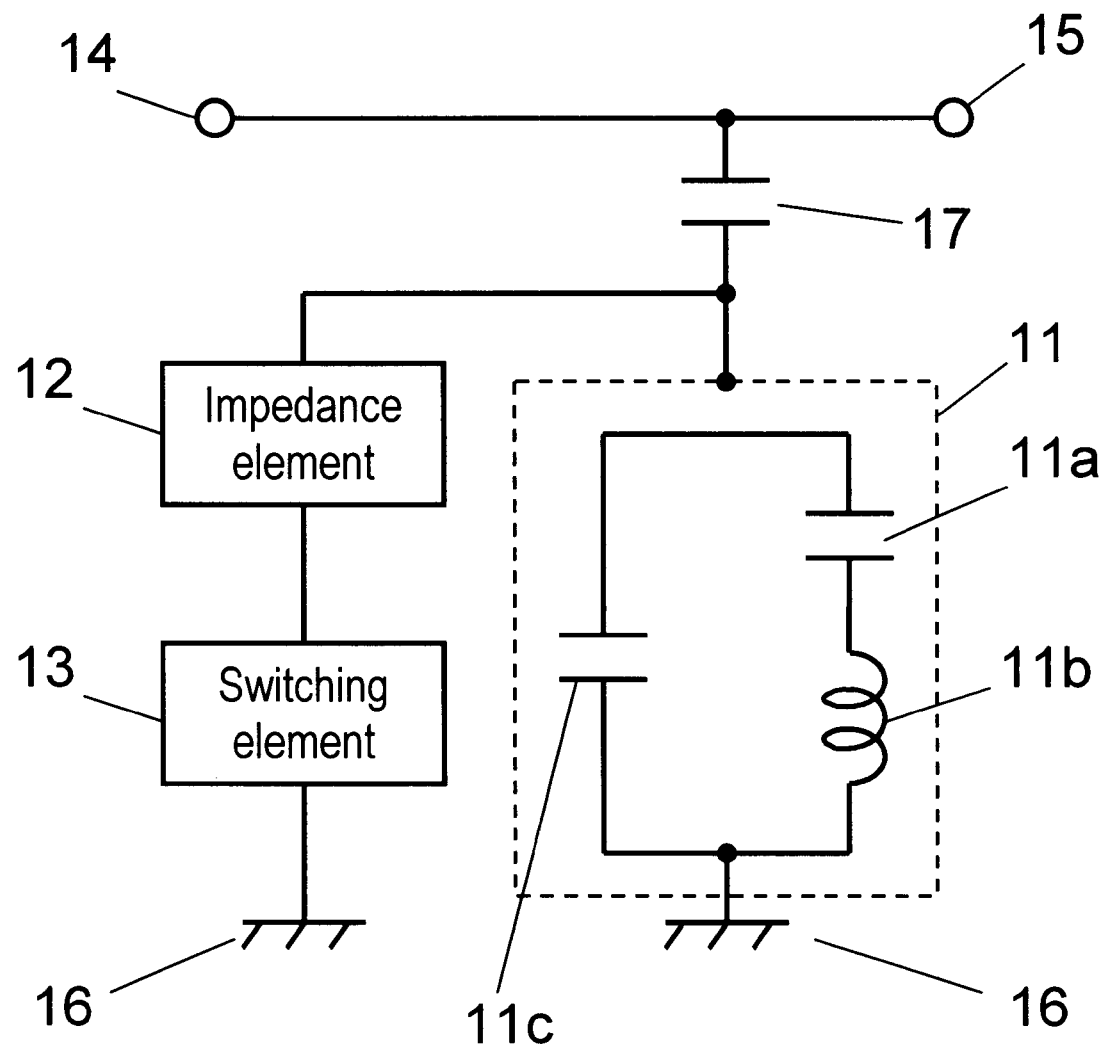
FIG. 5 is a block diagram of a second example of a resonator circuit used in a band switching filter in accordance with the first exemplary embodiment of the present invention.

To simultaneously shift the series resonant frequency and the parallel resonant frequency of a resonator circuit, it can be realized by a circuit configuration in which a capacitance element 17 is inserted between a junction point of input terminal 14 and output terminal 15 and a junction point of surface acoustic wave resonator 11 and impedance element 12 in FIG. 1. The new circuit is shown in FIG. 5.

Figure 6:
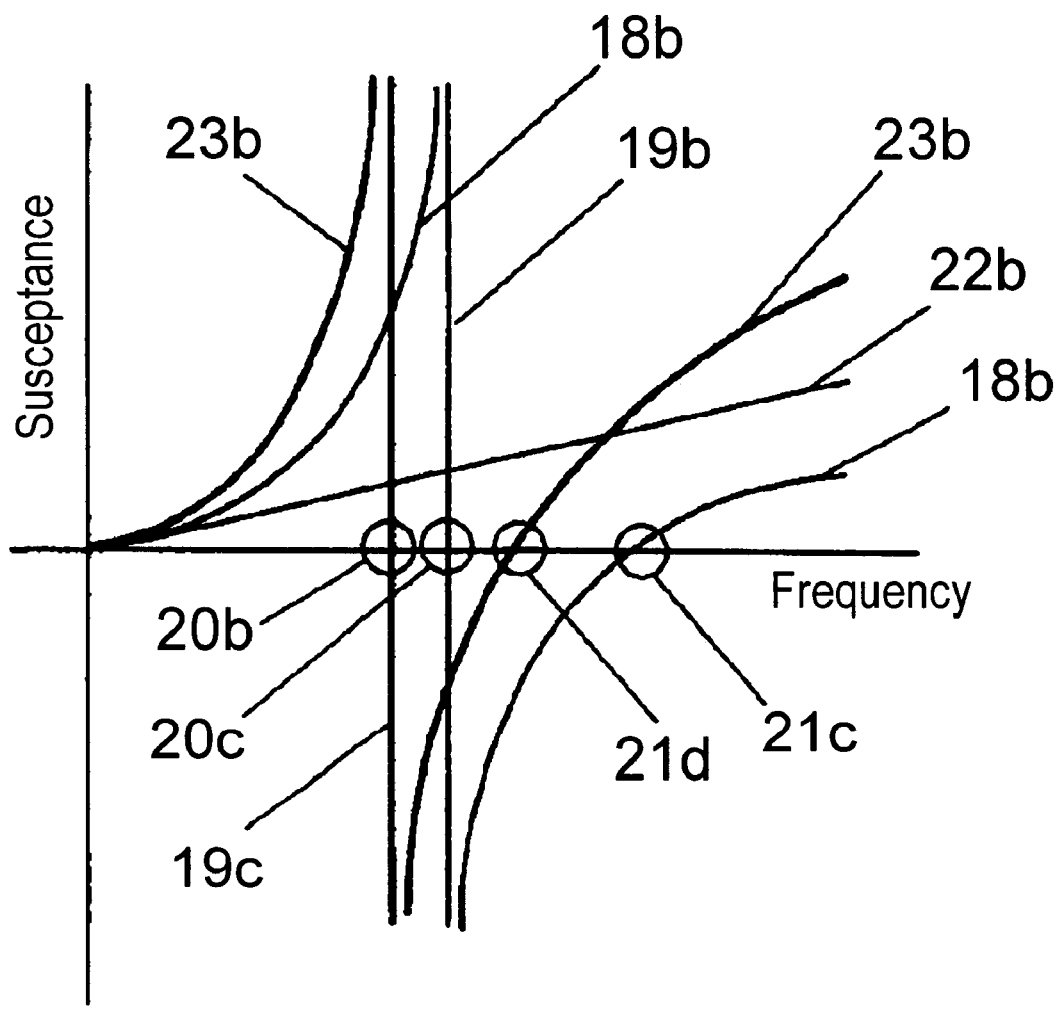
FIG. 6 shows a susceptance characteristic of the second example of a resonator circuit used in a band switching filter in accordance with a first exemplary embodiment of the present invention.
Figure 7:
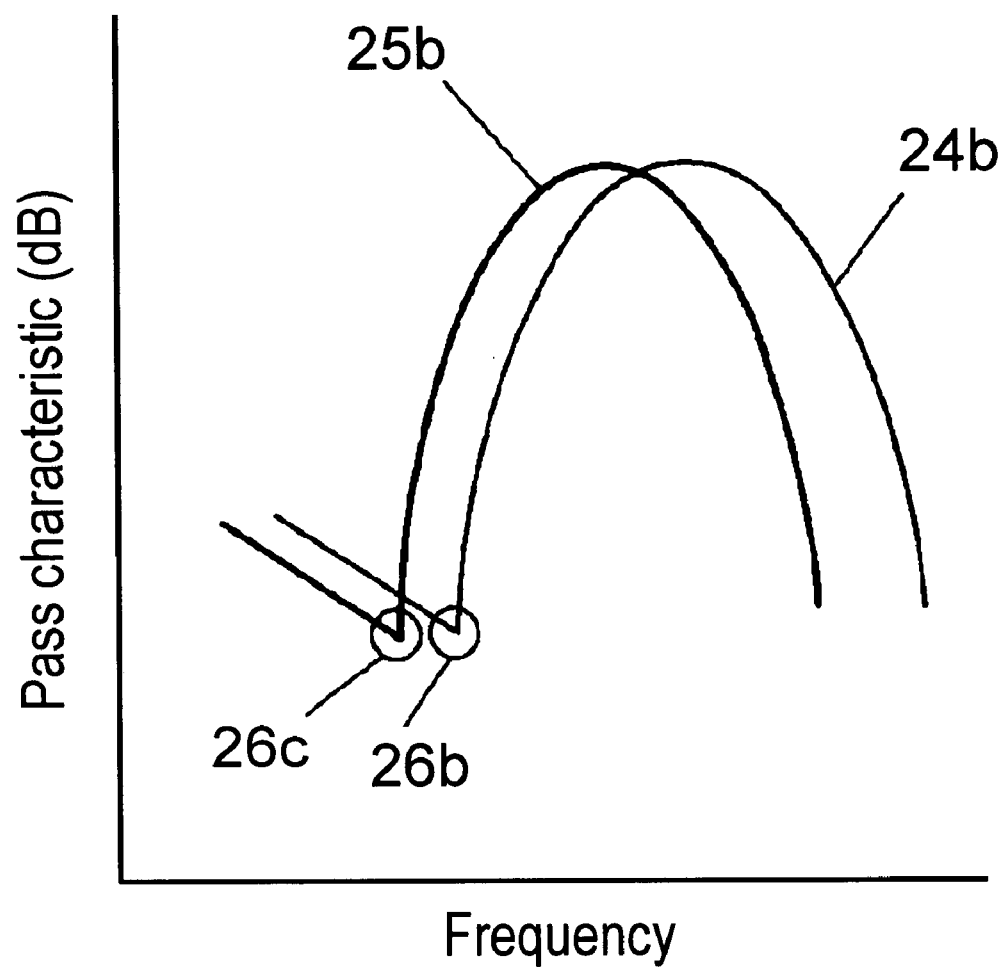
FIG. 7 shows a pass characteristic of the second example of a resonator circuit used in a band switching filter in accordance with a first exemplary embodiment of the present invention.

A susceptance characteristic of a resonator circuit and a pass characteristic looking output terminal 15 from input terminal 14 are shown in FIGS. 6 and 7, respectively. In FIG. 6, the susceptance of the resonator circuit when switching element 13 is open is shown by thin curves 18b, the asymptote in this case is shown as a thin vertical line 19b, the series resonant frequency is shown as a point 20c and the parallel resonant frequency is shown as a point 21c. In the case in which impedance element 12 is a capacitance element, the susceptance is shown as a thin straight line 22b, the susceptance of the resonator circuit when switching element 13 is shorted is shown by thick curves 23b, the asymptote in this case is shown as a thick vertical line 19c, the series resonant frequency is shown as a point 20b and the parallel resonant frequency is shown as a point 21d.

Therefore, as shown in FIG. 7, the pass frequency characteristic when the switching element is open is shown as a thin curve 24b, the attenuation pole is shown as a point 26b. The frequency characteristic when the switching element is short circuited is shown as a thick curve 25b, the attenuation pole is shown as a point 26c. As a result, both the pass band and the attenuation pole can be shifted to arbitrary other frequencies.

To shift only the series resonant frequency of a resonator circuit, it can be realized by a circuit configuration in which input terminal 14 and output terminal 15 are connected to a terminal of surface acoustic wave resonator 11, the other terminal of surface acoustic wave resonator 11 is connected to a terminal of impedance element 12a and a terminal of switching element 13 and both the other terminal of impedance element 12a and the other terminal of switching element 13 are connected to a ground 16. The new circuit is shown in FIG. 8.

Figure 8:
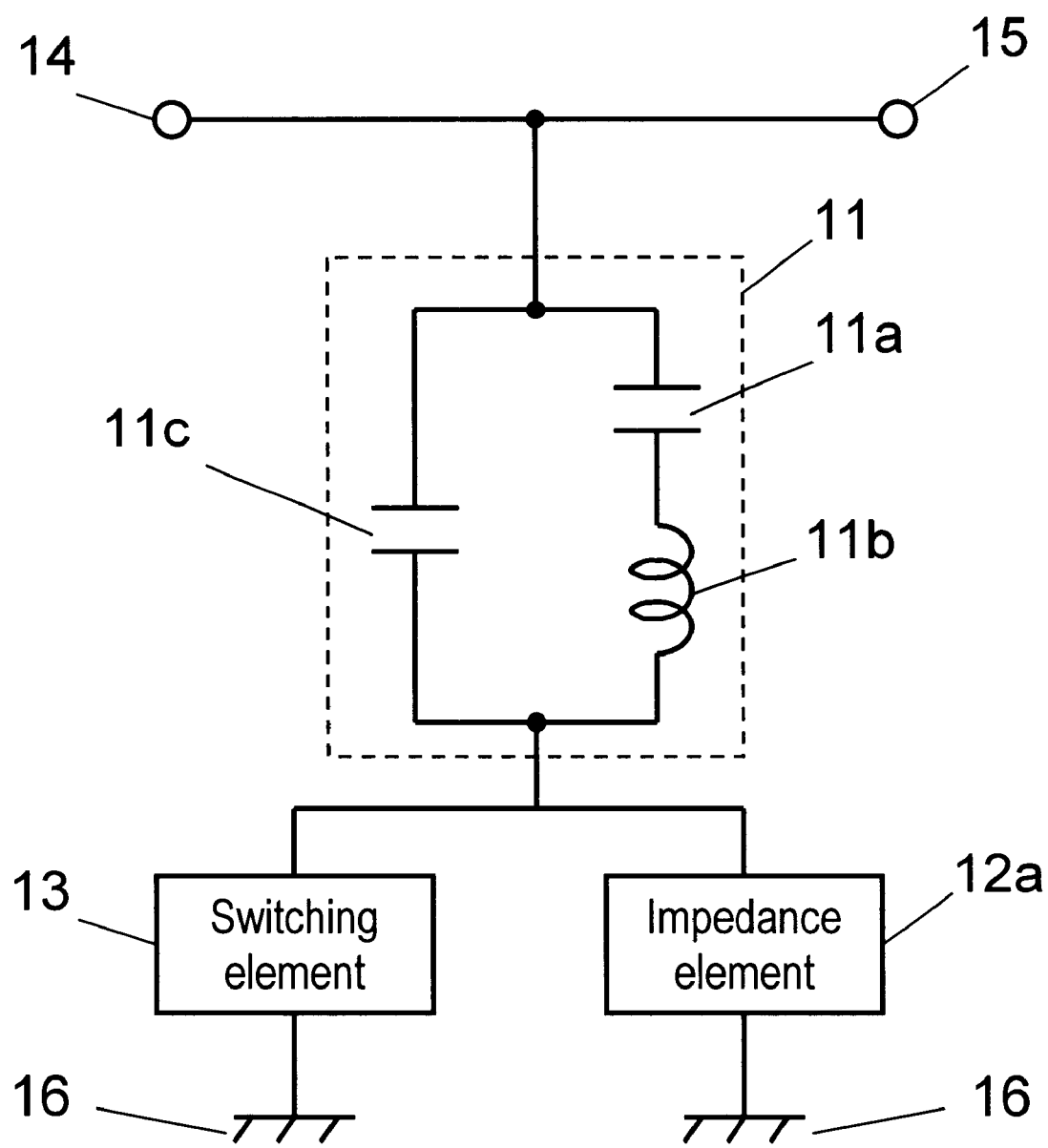
FIG. 8 is a block diagram of a third example of a resonator circuit used in a band switching filter in accordance with the first exemplary embodiment of the present invention.
Figure 9:
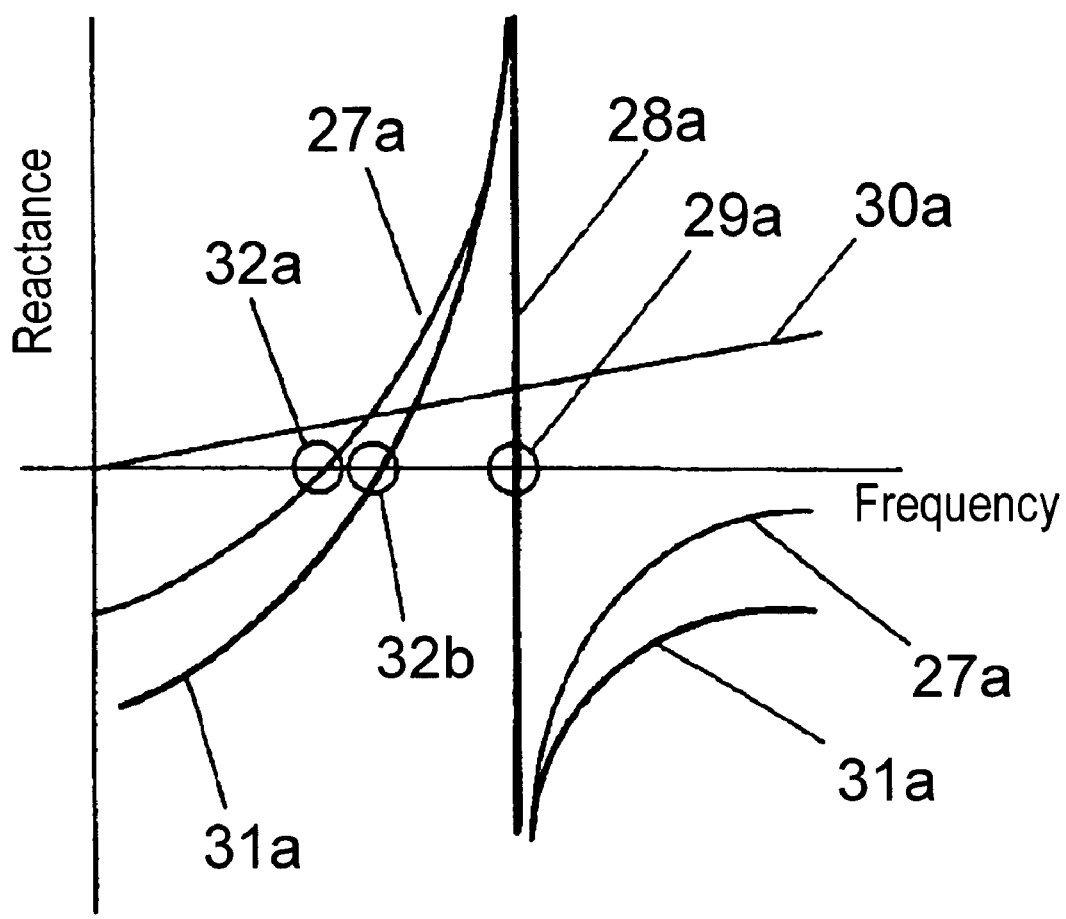
FIG. 9 shows a reactance characteristic of the third example of a resonator circuit used in a band switching filter in accordance with a first exemplary embodiment of the present invention.

A reactance characteristic of the resonator circuit shown in FIG. 8 is shown in FIG. 9 and a pass characteristic looking output terminal 15 from input terminal 14 is shown in FIG. 10. In FIG. 9, a reactance characteristic of a resonator circuit when switching element 13 is open is shown by thin curves 27a, the asymptote in this case is shown as a thick vertical line 28a, the series resonant frequency is shown as a point 32a and the parallel resonant frequency is shown as a point 29a. In the case in which impedance element 12a is an inductance element, the reactance is shown as a thin straight line 30a, the reactance of the resonator circuit when switching element 13 is shorted is shown by thick curves 31a, the asymptote in this case is shown as a thick vertical line 28a, the series resonant frequency is shown as a point 32b and the parallel resonant frequency is shown as a point 29a.

Therefore, as shown in FIG. 10, the frequency characteristic when the switching element is open is shown as a thin curve 24c, the attenuation pole is shown as a point 26d. The frequency characteristic when the switching element is shorted is shown as a thick curve 25c, the attenuation pole is shown as a point 26e. As a result, the attenuation pole can be shifted to an arbitrary other frequency.

(Second Exemplary Embodiment)

Figure 13:
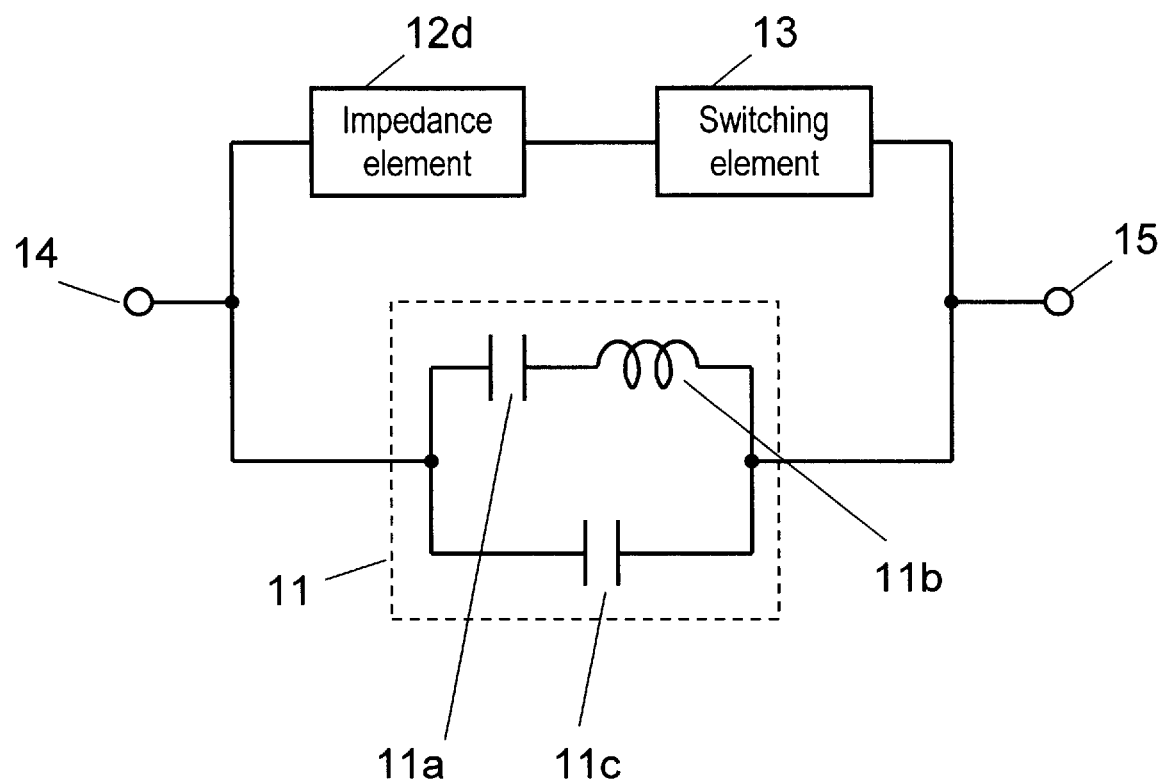
FIG. 13 is a block diagram of a first example of a resonator circuit used in a band switching filter in accordance with a second exemplary embodiment of the present invention.
Figure 14:
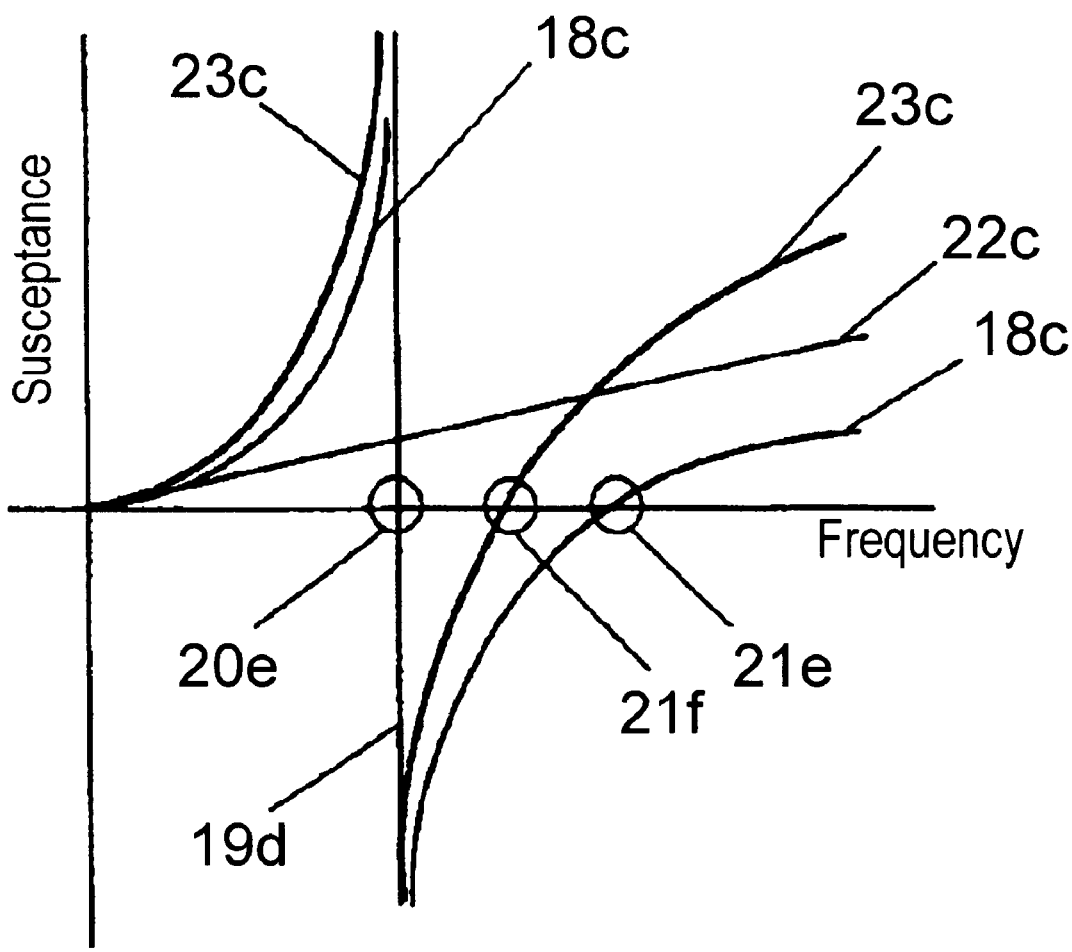
FIG. 14 shows a susceptance characteristic of the first example of a resonator circuit used in a band switching filter in accordance with a second exemplary embodiment of the present invention.
Figure 15:
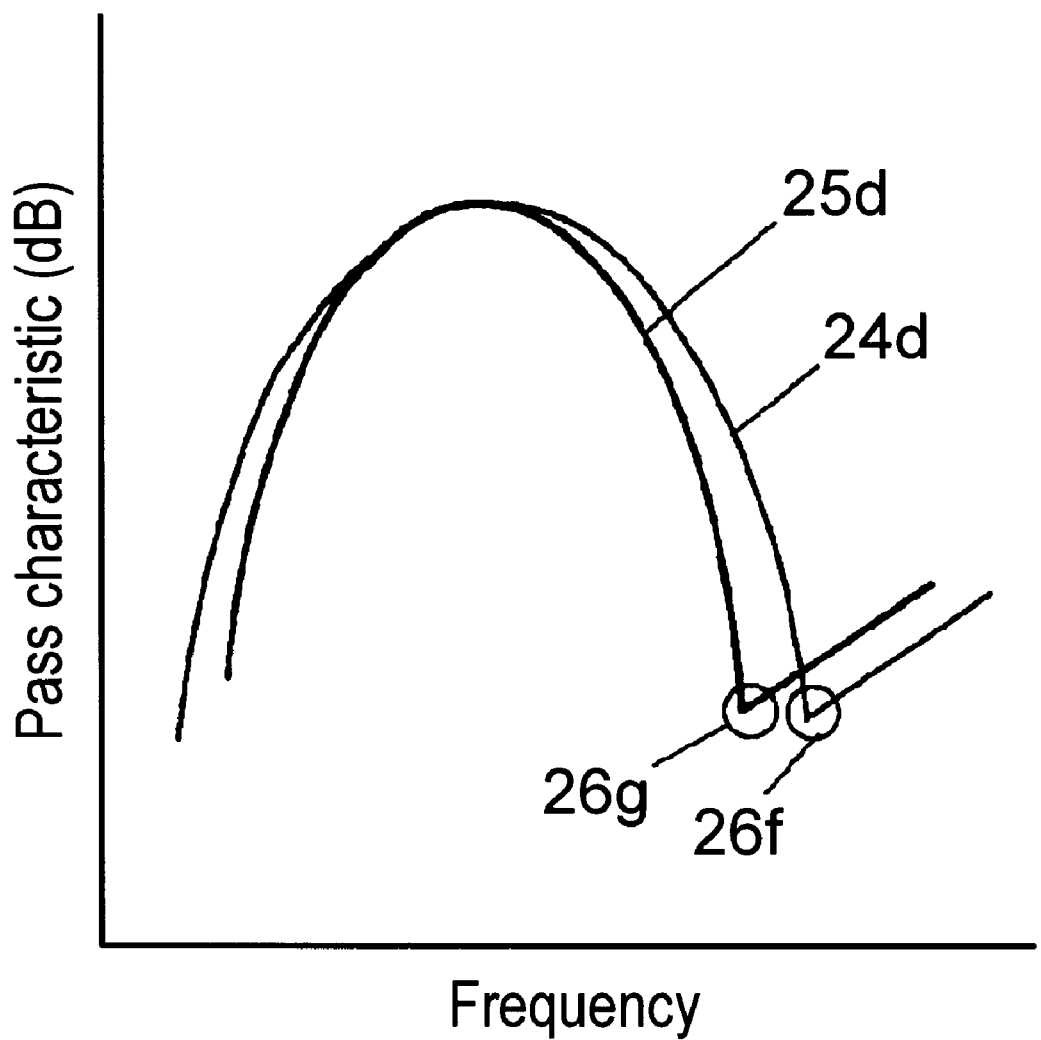
FIG. 15 shows a pass characteristic of the first example of a resonator circuit used in a band switching filter in accordance with a second exemplary embodiment of the present invention.
Figure 16:
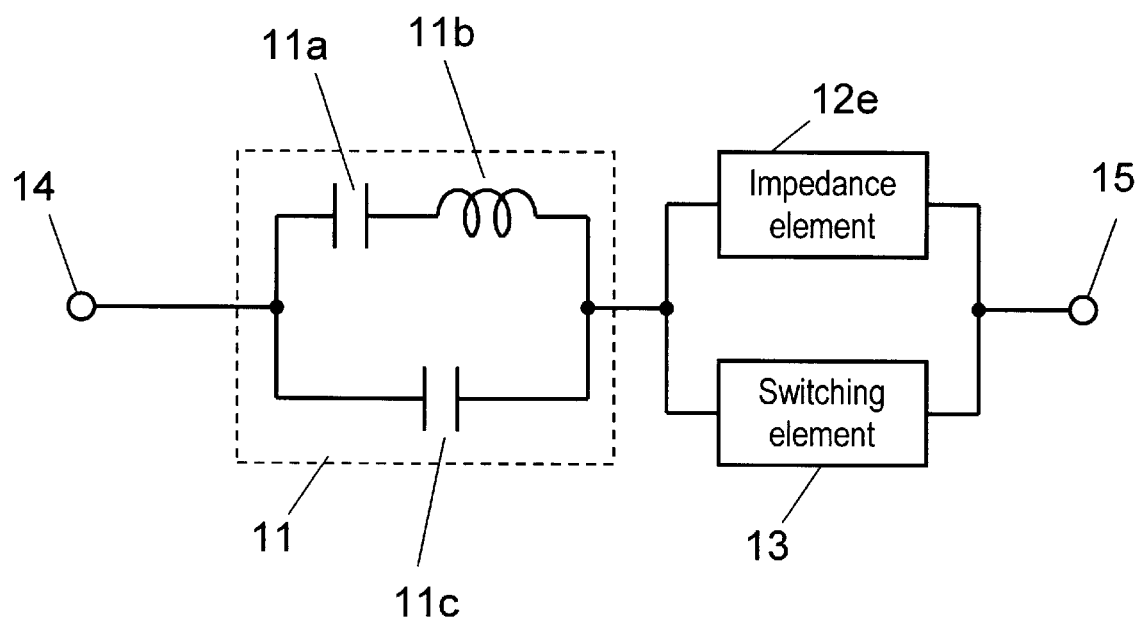
FIG. 16 is a block diagram of a second example of a resonator circuit used in a band switching filter in accordance with the second exemplary embodiment of the present invention.
Figure 17:
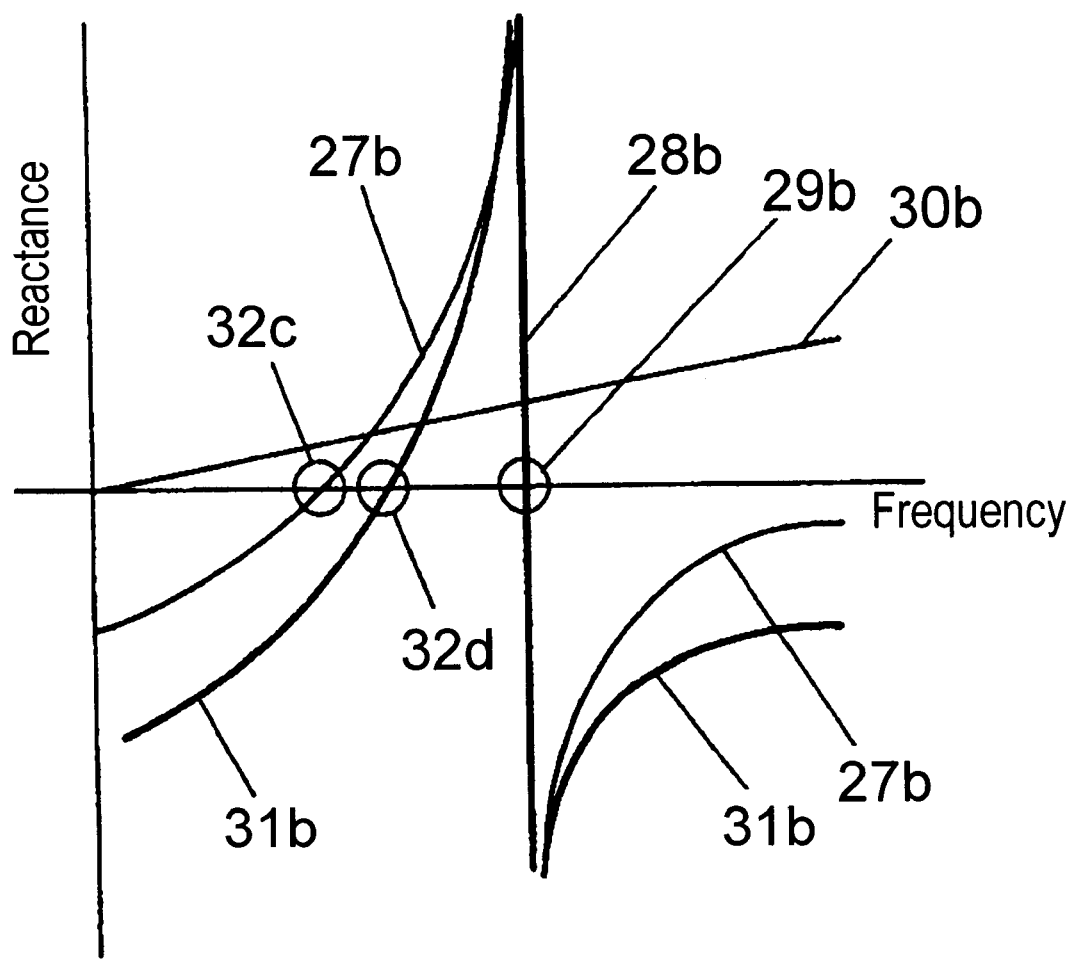
FIG. 17 shows a reactance characteristic of the second example of a resonator circuit used in a band switching filter in accordance with the second exemplary embodiment of the present invention.
Figure 19:
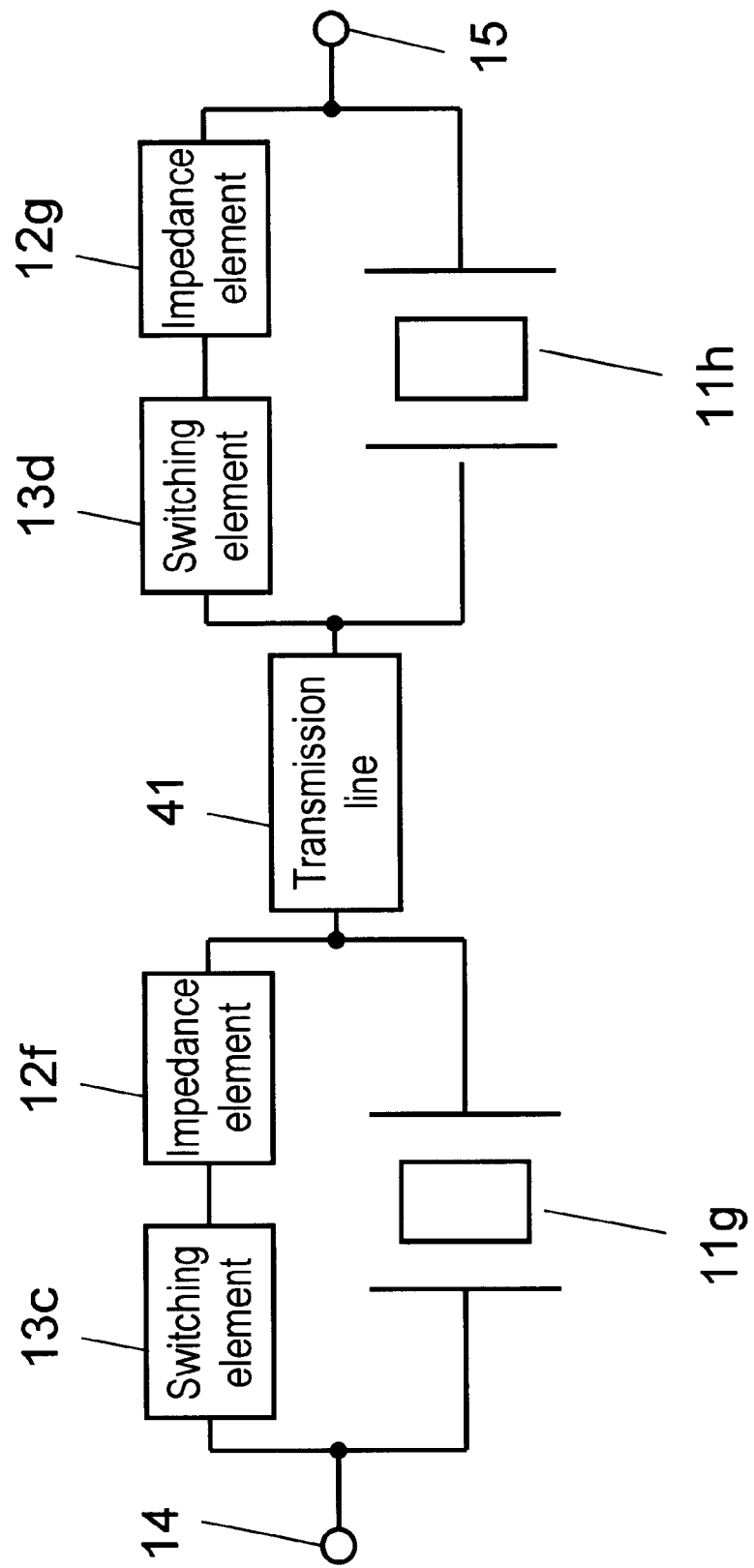
FIG. 19 is a block diagram of a band switching filter in accordance with the second exemplary embodiment of the present invention.
Figure 20:
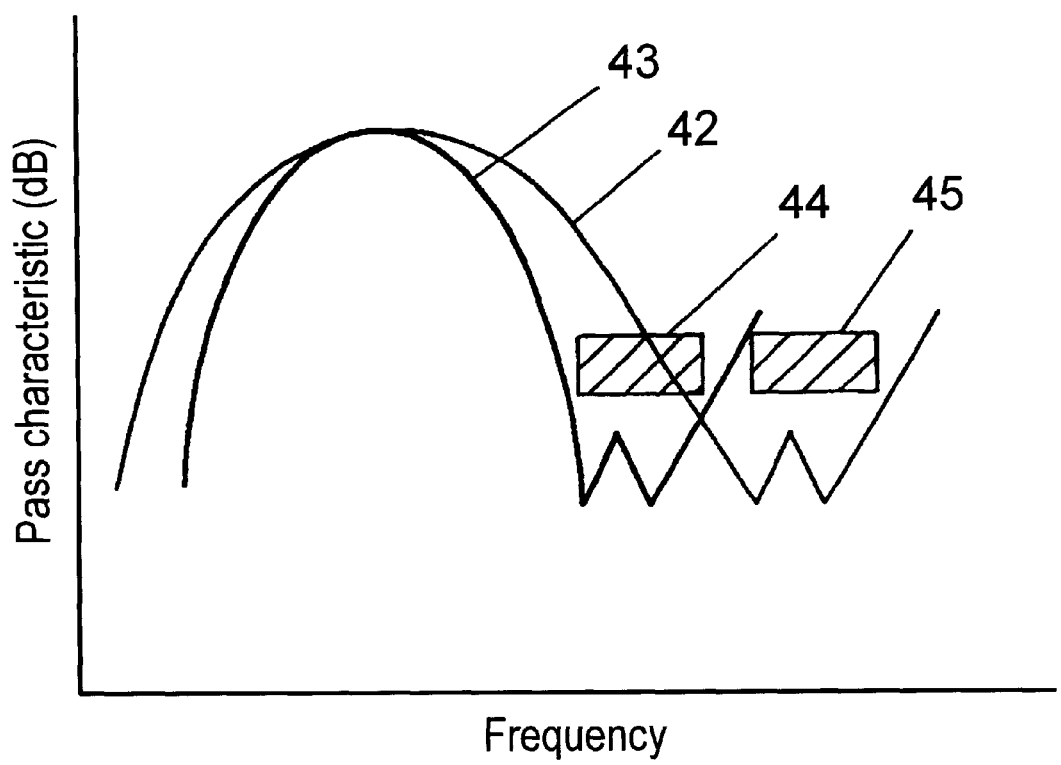
FIG. 20 shows a pass characteristic of the band switching filter in accordance with the second exemplary embodiment of the present invention.
Figure 21:
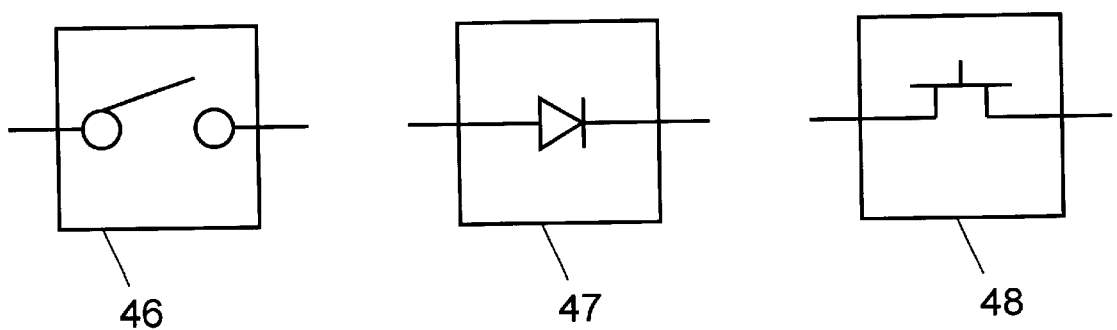
FIG. 21 shows symbols for the examples of a switching element used in the invention.

FIG. 13 is a block diagram of a first example of a resonator circuit used in a band switching filter in accordance with a second exemplary embodiment of the present invention. FIGS. 14 and 15 show its characteristics. FIG. 19 is a block diagram of a band switching filter. FIG. 20 shows its pass characteristics. FIGS. 16 and 17 are a block diagram of a second example of a resonator circuit used in a band switching filter in accordance with the second exemplary embodiment of the present invention and its characteristic, respectively. Here, because the resonator circuit 11 used in a band switching filter of the second exemplary embodiment of the present invention shown in FIG. 13 has basically the same construction as that shown in FIG. 1, the blocks having similar functions to those in FIG. 1 are numbered with the same reference number and the detailed explanation is omitted.

A resonator circuit shown in FIG. 13 is composed of a surface acoustic wave resonator 11, an impedance element 12d, a switching element 13, an input terminal 14 and an output terminal 15. Input terminal 14 is connected to a terminal of surface acoustic wave resonator 11 and a terminal of impedance element 12d and the other terminal of impedance element 12d is connected to a terminal of switching element 13 and both the other terminal of switching element 13 and surface acoustic wave resonator 11 are connected to output terminal 15.

According to a resonator circuit having the above configuration, a parallel resonant frequency of surface acoustic wave resonator 11 can be shifted to an arbitrary frequency. The function of the resonator circuit when impedance element 12d is a capacitance element is basically just as explained in the first exemplary embodiment. In FIG. 14, the susceptance of the resonator circuit when switching element 13 is open is shown by thin curves 18c, the asymptote in this case is shown as a thin vertical line 19d, the series resonant frequency is shown as a point 20e and the parallel resonant frequency is shown as a point 21e. In the case in which impedance element 12d is a capacitance element, the susceptance is shown as a thin straight line 22c and the susceptance of the resonator circuit when switching element 13 is shorted is shown by thick curves 23c. The asymptote in this case is shown as a thick vertical line 19d, the series resonant frequency is shown as a point 20e and they do not change from those when switching element 13 is open but the parallel resonant frequency is shown as a point 21f.

Therefore, as shown in FIG. 15, the pass frequency characteristic when the switching element 13 is open is shown as a thin curve 24d and the attenuation pole is shown as a point 26f. The pass frequency characteristic when the switching element 13 is shorted is shown as a thick curve 25d and the attenuation pole is shown as a point 26g. As a result, The attenuation pole can be shifted to an arbitrary frequency.

Because the connection of the resonator circuit against input terminal 14 and output terminal 15 is in series in the second exemplary embodiment (FIG. 13) while it is in parallel in the first exemplary embodiment (FIGS. 1, 5 and 8), the pass frequency characteristic (FIG. 15) of the second exemplary embodiment is different from those (FIGS. 4, 7, 10 and 12) of the first exemplary embodiment, that is, the attenuation poles 26f and 26g are higher than the pass bands.

A block diagram of a band switching filter using a resonator circuit shown in FIG. 13 is shown in FIG. 19 and its frequency characteristic is shown in FIG. 20.

The band switching filter shown in FIG. 19 is a band pass filter and comprises surface acoustic wave resonators 11g and 11h, impedance elements 12f and 12g, switching elements 13c and 13d, an input terminal 14, an output terminal 15 and a transmission line 41. Input terminal 14 is connected to one terminal of surface acoustic wave resonator 11g and one terminal of switching element 13c, the other terminal of switching element 13c is connected to one terminal of impedance elements 12f, the other terminal of impedance elements 12f is connected to the other terminal of surface acoustic wave resonator 11g and one terminal of transmission line 41. The other terminal of transmission line 41 is connected to one terminal of surface acoustic wave resonator 11h and one terminal of switching element 13d, the other terminal of switching element 13d is connected to one terminal of impedance elements 12g, the other terminal of impedance elements 12g is connected to the other terminal of surface acoustic wave resonator 11h and output terminal 15.

In FIG. 19, because the parallel resonant frequency of the resonator circuit is shifted by open- or short-circuiting switching elements 13c and 13d, the pass characteristic is as shown in FIG. 20. When switching element 13c and 13d are open, frequency characteristic 42 which attenuation band is 45 is obtained and when switching element 13c and 13d are shorted, frequency characteristic 43 which attenuation band is 44 is obtained. In both cases, the pass band does not change.

According to the above configuration, by using a band switching filter as well as by miniaturization of a resonator, a filter having a frequency characteristic in which both attenuation bands 44 and 45 are attenuated can be realized with less stages and it is hard to receive an effect of ground potential fluctuation.

To shift only the series resonant frequency of the resonator circuit, the following configuration shown in FIG. 16 is preferable. One terminal of surface acoustic wave resonator 11 is connected to input terminal 14, the other terminal of surface acoustic wave resonator 11 is connected to both one terminal of impedance element 12e and one terminal of switching element 13, both the other terminal of impedance element 12e and the other terminal of switching element 13 are connected to output terminal 15.

Figure 18:
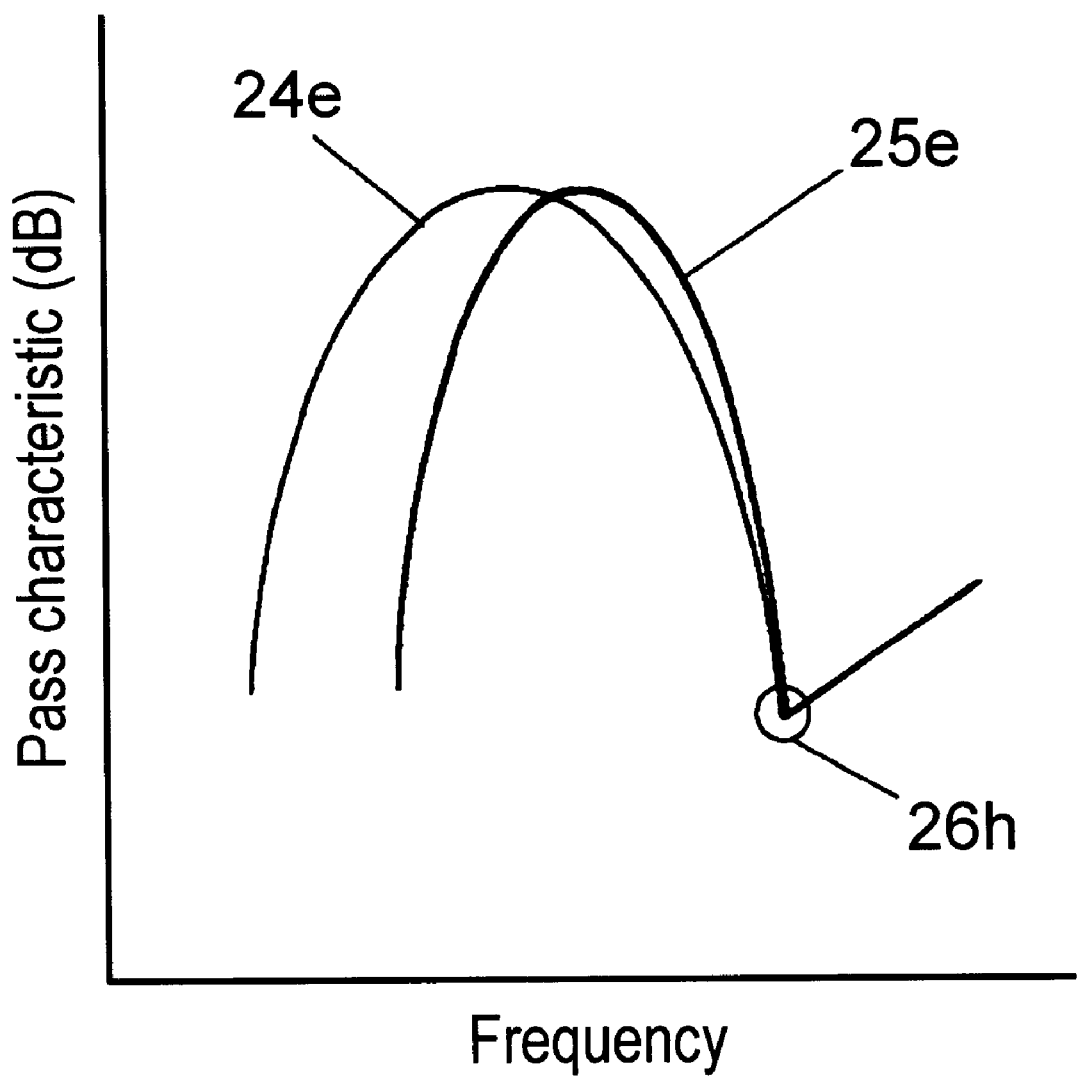
FIG. 18 shows a pass characteristic of the second example of a resonator circuit used in a band switching filter in accordance with the second exemplary embodiment of the present invention.

A reactance characteristic of a resonator circuit and a pass characteristic looking output terminal 15 from input terminal 14 shown in FIG. 16 are shown in FIGS. 17 and 18, respectively. In FIG. 17, the reactance of the resonator circuit when switching element 13 is open is shown as a thin curve 27b, the asymptote in this case is shown as a thick vertical line 28b, the series resonant frequency is shown as a point 32c and the parallel resonant frequency is shown as a point 29b. The reactance when impedance element 12e is an inductance element is shown as a thin straight line 30b, the reactance of the resonator circuit when switching element 13 is shorted is shown as a thick curve 31b, the asymptote in this case is shown as a thick vertical line 28b, the series resonant frequency is shown as a point 32d and the parallel resonant frequency is shown as a point 29b.

Therefore, as shown in FIG. 18, the pass frequency characteristic when the switching element 13 is open is shown as a thin curve 24e and the attenuation pole is shown as a point 26h. The pass frequency characteristic when the switching element 13 is shorted is shown as a thick curve 25e and the attenuation pole is shown as a point 26h. As a result, The pass band can arbitrarily be shifted without shifting the frequency of the attenuation pole.

By applying band switching filters in accordance with the first or second exemplary embodiment of the present invention to an antenna duplexer, it becomes easily possible to miniaturize the antenna duplexer.

Figure 22:
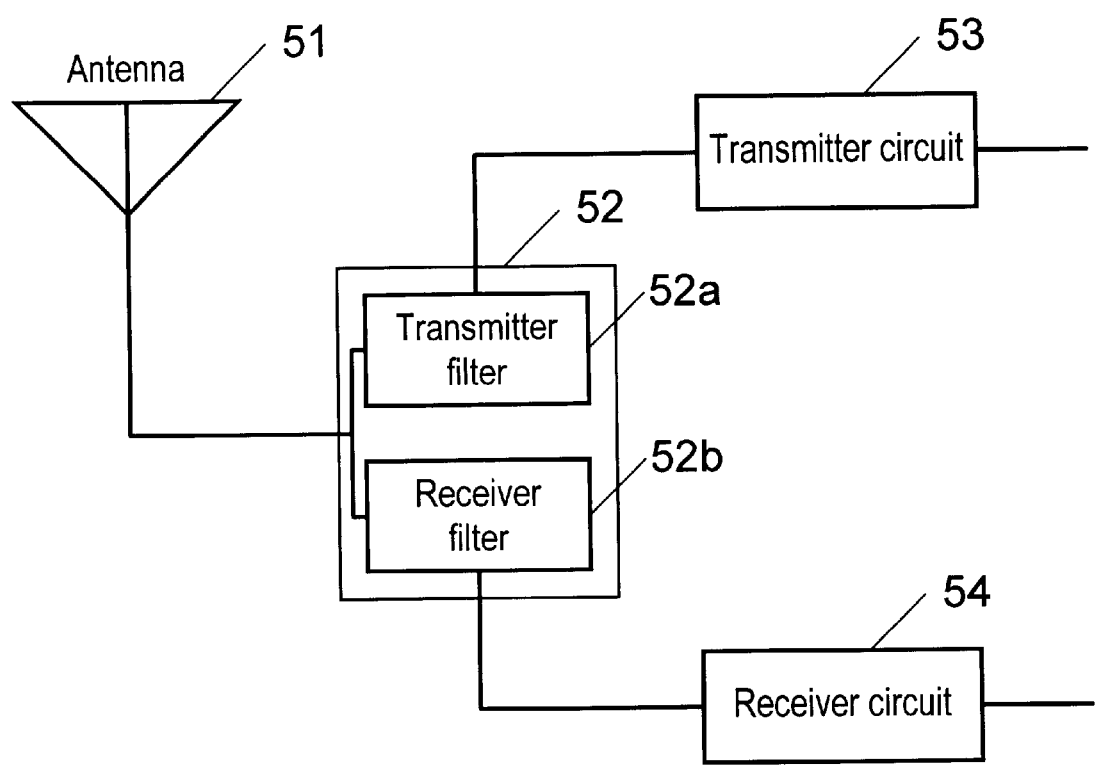
FIG. 22 is a block diagram of a radio frequency circuit part of a portable telephone.
Figure 23:
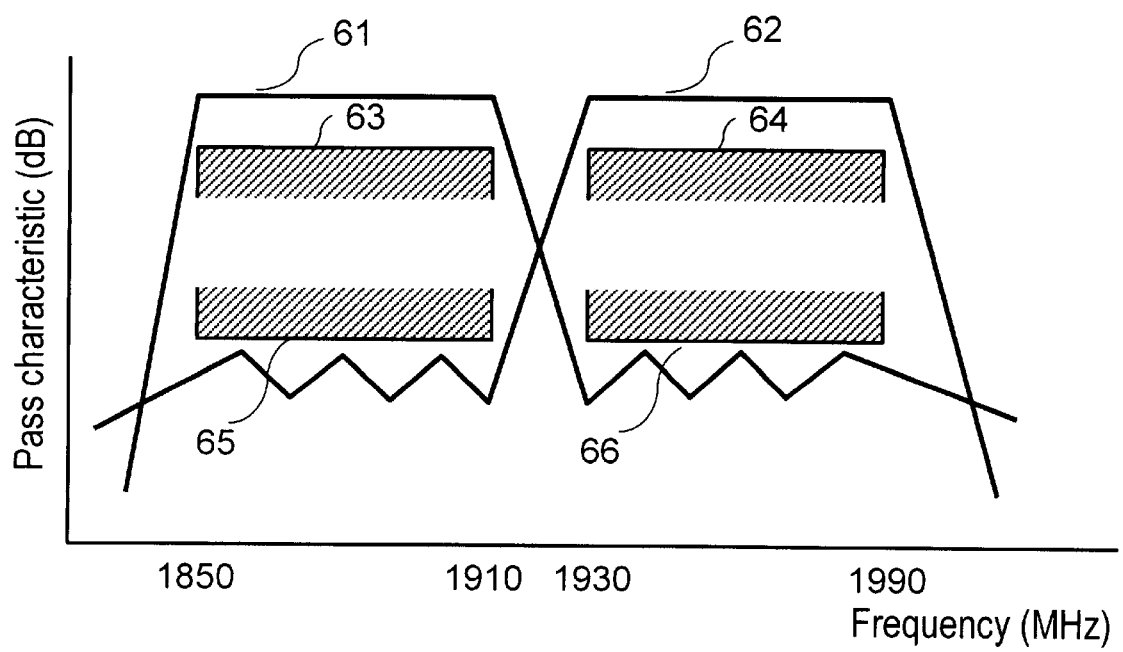
FIG. 23 shows a pass characteristic of an antenna duplexer of the prior art.

It is explained below in brief, taking an American Personal Cellular System for instance and referring to FIGS. 22–24. An antenna duplexer 52 is composed of a transmitter filter 52a and receiver filter 52b, each having different pass band. Transmitter filter 52a is electrically connected to an antenna 51 and a transmitter circuit 53 and receiver filter 52b is electrically connected to antenna 51 and a receiver circuit 54. The transmitter band frequency is 1850 MHz to 1910 MHz and the receiver band frequency is 1930 MHz to 1990 MHz. A usual antenna duplexer is composed of a transmitter filter 52a having a pass characteristic 61 of pass band 63 and attenuation band 66 and a receiver filter 52b having a pass characteristic of pass band 64 and attenuation band 65 as shown in FIG. 23.

In this case, because it is necessary to have pass band of 60 MHz and attenuate the band 20 MHz apart from the pass band, it is necessary to make the number of filter stages and secure a steep attenuation characteristic. As a result, not only the filter shapes of both transmitter filter 52a and receiver filter 52b become large but also the insertion loss becomes big and a characteristic deterioration is inevitable.

To solve this problem, the transmission band is separated into two bands, 1850 MHz to 1885 MHz and 1885 MHz to 1910 MHz and the reception band is separated into also two bands, 1930 MHz to 1965 MHz and 1965 MHz to 1990 MHz and a band switching filter of the present invention is used.

Figure 24:
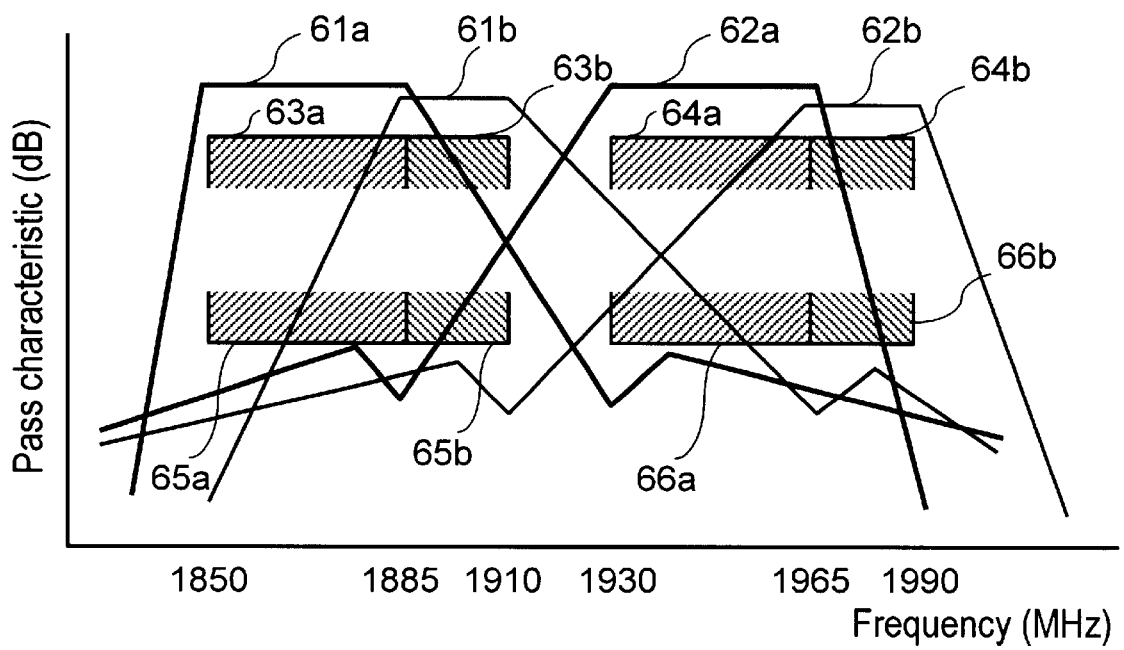
FIG. 24 shows a pass characteristic of a usual antenna duplexer using band switching filters of the present invention.

A pass band characteristic in this case is shown in FIG. 24. A band switching filter which can switch between a pass characteristic 61a having pass band 63a and attenuation band 66a and a pass characteristic 61b having pass band 63b and attenuation band 66b is used for a transmitter filter and a band switching filter which can switch between a pass characteristic 62a having pass band 64a and attenuation band 65a and a pass characteristic 62b having pass band 64b and attenuation band 65b is used for a receiver filter. Comparing with a filter used in a usual antenna duplexer, the pass band is about half and the attenuation band is about two times apart from the pass band and less number of filter stages is enough and a miniaturization of the antenna duplexer can be realized.

As a switching element, an element such as a mechanical switch 46, a PIN diode 47 or a FET (field-effect transistor) element 48 shown in FIG. considered. In any case, it is necessary to arrange the element so that two terminals of the element can be made open or shorted and to select it considering power dissipation of a band switching filter and a current for switching and so on.

In the case in which a switching element and an impedance element is connected in series as shown in FIG. 1, each element can be replaced each other or each element can be replaced by a connection of plural pieces.

To adjust the frequency to be shifted, an impedance element can be connected between switching element 13 and ground 16 in the circuit configuration shown in FIG. 8.

The present invention relates to a band switching filter selectively passing or attenuating only one band of two different bands, which forms a resonator circuit comprising at least a surface acoustic wave resonator, a switching element and an impedance element and shifts at least one of two resonant frequencies of the surface acoustic wave resonator to the other frequency by switching a connection state of the surface acoustic wave resonator and the impedance element by open- or short-circuiting the switching element. According to the present invention it is possible not only to miniaturize a resonator but also to reduce number of filter stages by band switching and as a result, miniaturization of a band switching filter can be realized.

The present invention relates to a band switching filter selectively passing or attenuating only one band of two different bands, which forms a resonator circuit comprising at least a surface acoustic wave resonator, a switching element and an impedance element and in which one terminal of the surface acoustic wave resonator, one terminal of the impedance element and one terminal of the switching element are altogether connected and the other terminal of the impedance element and the other terminal of the switching element are connected. According to the present invention, it becomes possible to miniaturize a resonator circuit and to reduce number of filter stages without being effected by a subtle drift of a ground potential by shifting a series resonant frequency of the surface acoustic wave resonator, namely band switching and as a result, miniaturization of a band switching filter can be realized.

The invention may be embodied in other specific form without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A band switching filter comprising:
   a surface acoustic wave resonator,
   an impedance element coupled to a first terminal of said surface acoustic wave resonator, a switching element coupled to said impedance element and a second terminal of said surface acoustic wave resonator, and a capacitance element coupled to said first terminal of said surface acoustic wave resonator, thereby said band switching filter capable of simultaneously switching a series resonant frequency and a parallel resonant frequency of said surface acoustic wave resonator.

2. The band switching filter of claim 1 wherein the capacitance element is also coupled between an input terminal and an output terminal.

3. An antenna duplexer comprising:

a plurality of band pass filters having respective pass bands of different frequencies, each filter including
i) a surface acoustic wave resonator,
ii) an impedance element coupled to a first terminal of said surface acoustic wave resonator,
iii) a switching element coupled to said impedance element and a second terminal of said surface acoustic wave resonator, and
iv) a capacitance element coupled to said first terminal of said surface acoustic wave resonator, thereby said band switching filter capable of simultaneously switching a series resonant frequency and a parallel resonant frequency of said surface acoustic wave resonator, wherein each of said plurality of band pass filters attenuates a pass band of another of said plurality of band pass filters.

4. The antenna duplexer of claim 3 wherein the plurality of band pass filters is two band pass filters.

* * * * *